(12) United States Patent
Mahler et al.

(10) Patent No.: US 9,953,952 B2
(45) Date of Patent: Apr. 24, 2018

(54) SEMICONDUCTOR DEVICE HAVING A SEALANT LAYER INCLUDING CARBON DIRECTLY CONTACT THE CHIP AND THE CARRIER

(75) Inventors: Joachim Mahler, Regensburg (DE);
Michael Juerss, Regenstauf (DE);
Stefan Landau, Wehrheim (DE)

(73) Assignee: Infineon Technologies AG, Neubiberg (DE)

( * ) Notice: Subject to any disclaimer, the term of this patent is extended or adjusted under 35 U.S.C. 154(b) by 617 days.

(21) Appl. No.: 12/195,200

(22) Filed: Aug. 20, 2008

(65) Prior Publication Data

US 2010/0044841 A1 Feb. 25, 2010

(51) Int. Cl.
*H01L 23/34* (2006.01)
*H01L 23/00* (2006.01)
*H01L 23/31* (2006.01)

(52) U.S. Cl.
CPC .......... *H01L 24/85* (2013.01); *H01L 23/3135* (2013.01); *H01L 23/3142* (2013.01); *H01L 23/564* (2013.01); *H01L 24/19* (2013.01); *H01L 24/24* (2013.01); *H01L 24/40* (2013.01); *H01L 24/48* (2013.01); *H01L 24/82* (2013.01); *H01L 23/3107* (2013.01); *H01L 23/3128* (2013.01); *H01L 24/16* (2013.01); *H01L 24/28* (2013.01); *H01L 24/29* (2013.01); *H01L 24/45* (2013.01); *H01L 24/73* (2013.01); *H01L 2224/0557* (2013.01); *H01L 2224/05571* (2013.01); *H01L 2224/05573* (2013.01); *H01L 2224/16225* (2013.01); *H01L 2224/24051* (2013.01); *H01L 2224/24226* (2013.01); *H01L 2224/24246* (2013.01); *H01L 2224/32225* (2013.01); *H01L 2224/32245* (2013.01); *H01L 2224/45014* (2013.01); *H01L 2224/4554* (2013.01); *H01L 2224/45124* (2013.01); *H01L 2224/45139* (2013.01); *H01L 2224/45144* (2013.01); *H01L 2224/45147* (2013.01); *H01L 2224/45169* (2013.01); *H01L 2224/45669* (2013.01); *H01L 2224/48091* (2013.01); *H01L 2224/48247* (2013.01); *H01L 2224/48472* (2013.01); *H01L 2224/48599* (2013.01); *H01L 2224/48699* (2013.01); *H01L 2224/73204* (2013.01); *H01L 2224/73221* (2013.01); *H01L 2224/73265* (2013.01); *H01L 2224/8385* (2013.01); *H01L 2224/83101* (2013.01); *H01L 2224/83801* (2013.01); *H01L 2224/8592* (2013.01); *H01L 2224/92* (2013.01); *H01L 2224/92247* (2013.01); *H01L 2924/00014* (2013.01); *H01L 2924/014* (2013.01); *H01L 2924/01006* (2013.01); *H01L 2924/01014* (2013.01); *H01L 2924/01029* (2013.01);
(Continued)

(58) Field of Classification Search
CPC .................. H01L 23/3135; H01L 23/3142
USPC ........... 257/790, E23.118, E23.126, E23.127
See application file for complete search history.

(56) References Cited

U.S. PATENT DOCUMENTS 3,549,368 A 12/1970 Collins et al.
4,753,855 A 6/1988 Haluska et al.
(Continued)

*Primary Examiner* — Anh Mai
(74) *Attorney, Agent, or Firm* — Dicke, Billig & Czaja, PLLC

(57) ABSTRACT

A semiconductor device includes a carrier, a chip attached to the carrier, a sealant vapor deposited over the chip and the carrier, and encapsulation material deposited over the sealed chip and the sealed carrier.

6 Claims, 12 Drawing Sheets

(52) U.S. Cl.
CPC ............... *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/0781* (2013.01); *H01L 2924/07802* (2013.01); *H01L 2924/15311* (2013.01); *H01L 2924/181* (2013.01)

(56) References Cited

U.S. PATENT DOCUMENTS

| | | | | |
|---|---|---|---|---|
| 5,096,851 | A | * | 3/1992 | Yamazaki et al. ............ 438/127 |
| 5,309,398 | A | | 5/1994 | Nagase et al. |
| 5,643,343 | A | * | 7/1997 | Selifanov et al. ............. 51/306 |
| 5,847,443 | A | | 12/1998 | Cho et al. |
| 5,897,443 | A | | 4/1999 | Glaser |
| 6,013,109 | A | * | 1/2000 | Choi ............................ 438/124 |
| 6,191,492 | B1 | | 2/2001 | Yamazaki et al. |
| 6,200,912 | B1 | | 3/2001 | Aoi |
| 6,368,899 | B1 | * | 4/2002 | Featherby et al. ............ 438/127 |
| 6,677,549 | B2 | * | 1/2004 | Suzuki et al. ............ 219/121.41 |
| 7,279,239 | B2 | | 10/2007 | Akedo et al. |
| 2006/0214159 | A1 | | 9/2006 | Nakayama et al. |
| 2007/0040186 | A1 | | 2/2007 | Fillion et al. |
| 2007/0145606 | A1 | * | 6/2007 | Mahler et al. ................ 257/783 |
| 2007/0262426 | A1 | * | 11/2007 | Mahler ........................ 257/669 |
| 2008/0173988 | A1 | | 7/2008 | Mengel |
| 2008/0173992 | A1 | | 7/2008 | Mahler |
| 2010/0015744 | A1 | * | 1/2010 | Kazinzci ......................... 438/52 |
| 2010/0099223 | A1 | * | 4/2010 | Mahler et al. ................ 438/127 |
| 2017/0338169 | A1 | * | 11/2017 | Mahler ............. H01L 23/49541 |

* cited by examiner

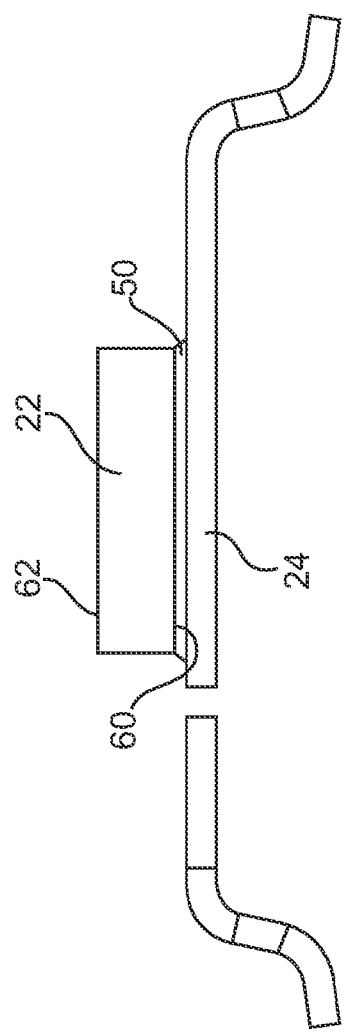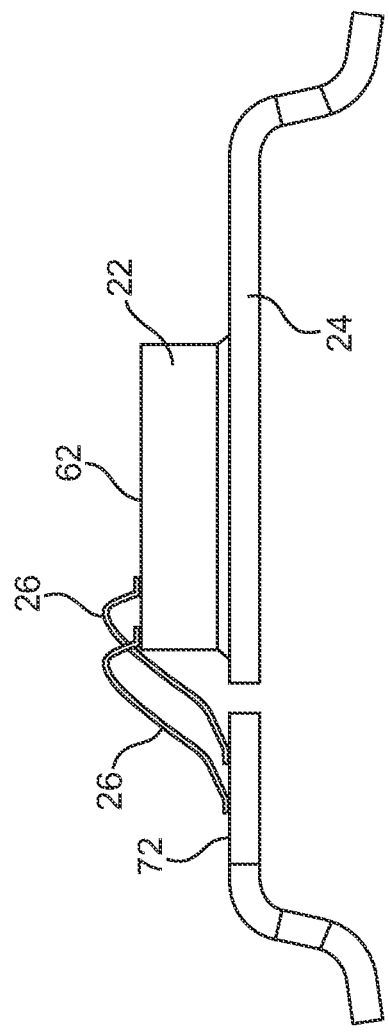

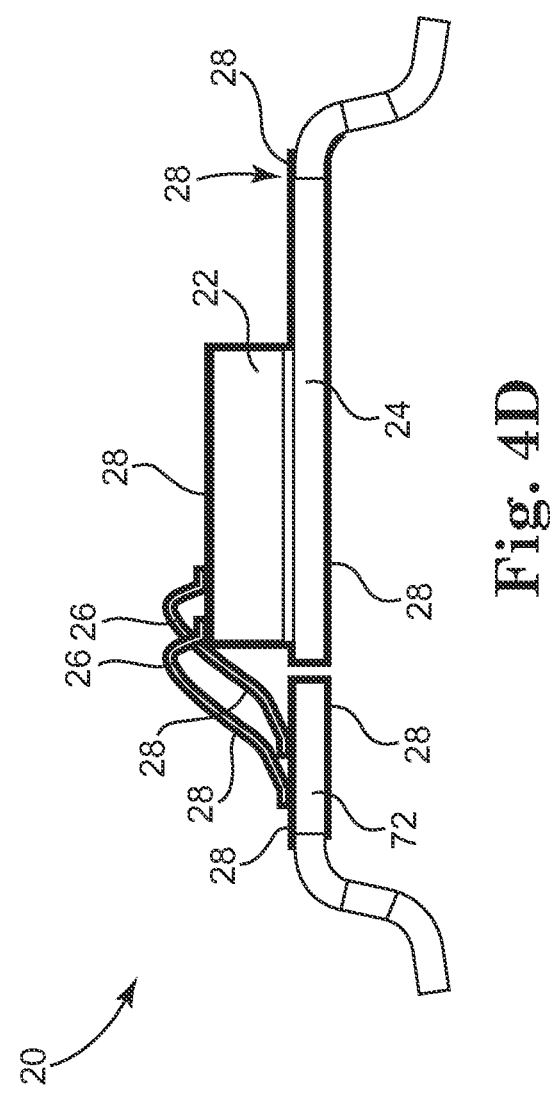

SEMICONDUCTOR DEVICE HAVING A SEALANT LAYER INCLUDING CARBON DIRECTLY CONTACT THE CHIP AND THE CARRIER

BACKGROUND

Market demand for smaller and more functional electronic devices has driven the development of semiconductor devices, including semiconductor power packages and entire systems disposed on a chip. Some electronic devices, such as cellular telephones, employ a variety of design-specific electronic components. Other electronic devices, such as power packages utilized in the automotive industry, employ one or more logic chips connected to a carrier and one or more power transistors connected to the carrier and the logic chip(s). The space available inside the electronic devices is limited, particularly as the electronic devices are made smaller.

Wire bonds are employed in some known semiconductor packages to electrically connect the chip(s) to the carrier. The wire bonds are time consuming to connect, but when attached, provide a first level interconnect communicating between the chip and the outside world. The wire connectors are susceptible to oxidation and/or corrosion when exposed to ambient conditions, which undesirably reduces the electrical performance of the semiconductor package. In part to address this issue, the package is typically encapsulated within a plastic protective housing, where the plastic encapsulation material covers the wires and the chip. However, the wire connectors also have a tendency to oxidize and/or corrode if moist air enters through the encapsulation material.

For these and other reasons there is a need for the present invention.

SUMMARY

One aspect provides a semiconductor device including a carrier, a chip attached to the carrier, a sealant vapor deposited over the chip and the carrier, and encapsulation material deposited over the sealed chip and the sealed carrier.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4A is a cross-sectional view of a semiconductor chip attached to a carrier.

FIG. 4B is a cross-sectional view of connectors attached between the chip and the carrier illustrated in FIG. 4A.

FIG. 4D is a cross-sectional view of the semiconductor device illustrated in FIG. 4B having exposed surfaces coated with a sealant/insulator according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide a semiconductor package including a carrier, a chip attached to the carrier, a sealant vapor deposited over the chip and the carrier, and encapsulation material deposited over the sealed chip and the sealed carrier. The sealant promotes adhesion between the encapsulation material and the chip, which minimizes the possibility of the encapsulation material delaminating from the chip during use. In addition, the sealant protects the chip and the carrier from undesirable corrosion and/or oxidation that degrades the electrical performance of the chip.

Embodiments provide a semiconductor device including a chip electrically connected to a carrier by one or more connectors, and a sealant vapor deposited over an exterior surface of the connector, the active surface and sides of the chip, and a portion of the carrier that is not covered by the chip. The sealant is configured to be vapor deposited over all of the exposed surfaces of the electrically connected semiconductor device to provide a hermetic seal that protects the components against oxidation and corrosion. In one embodiment, the sealant is configured to provide good adhesion between the semiconductor components and an encapsulation layer molded over the semiconductor components. Embodiments of the sealant include inorganic sealants and amorphous carbon layers that seal the semiconductor components from moisture and oxidation.

Figure 1:
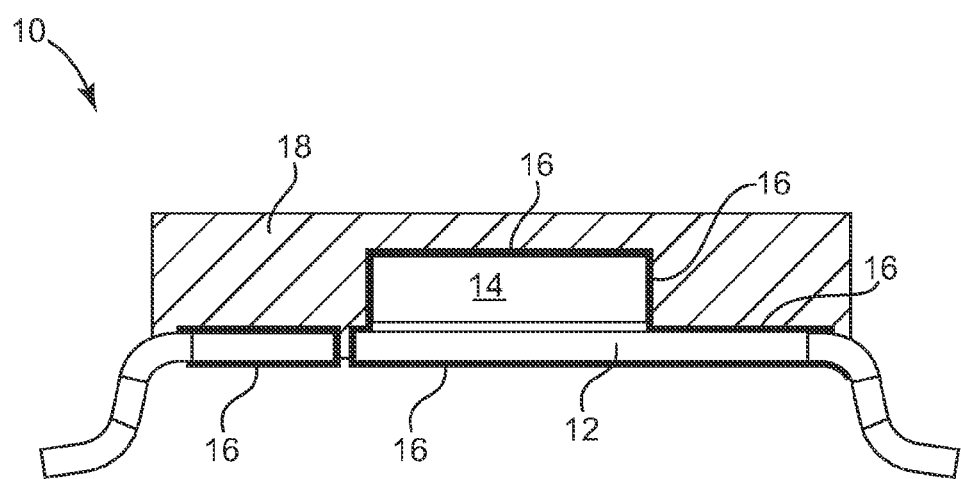
FIG. 1 is a cross-sectional view of a semiconductor package including a chip connected to a carrier and a sealant disposed between the chip and encapsulation material according to one embodiment.

FIG. 1 is a cross-sectional view of one embodiment of a semiconductor package 10 including a carrier 12, a chip 14 attached to carrier 12, a sealant layer 16 deposited over chip 14 and carrier 12, and encapsulation material 18 disposed over chip 14 and a portion of carrier 12.

In one embodiment, carrier 12 is a leadframe, although other carriers are also acceptable, such as substrates including laminated, flex, ceramic, and silicon substrates and non-leaded frames. Chip 14 is connected to carrier 12 in a suitable manner, which includes electrically connecting chip 14 to carrier 12. Sealant layer 16 provides a hermetic seal that protects carrier 12 and chip 14 from oxidation and corrosion and provides improved adhesion between these components and encapsulation material 18. Sealant layer 16 is provided as a carbon insulator, a carbon-containing layer such as hexamethyldisilazane, an amorphous a carbon-containing layer, or a vapor deposited insulator configured to protect the components coated by layer 16 from humidity, moisture, or oxidation during operation of chip 14. Encapsulation material 18 is a dielectric that protects chip 14 and carrier 12.

Figure 2:
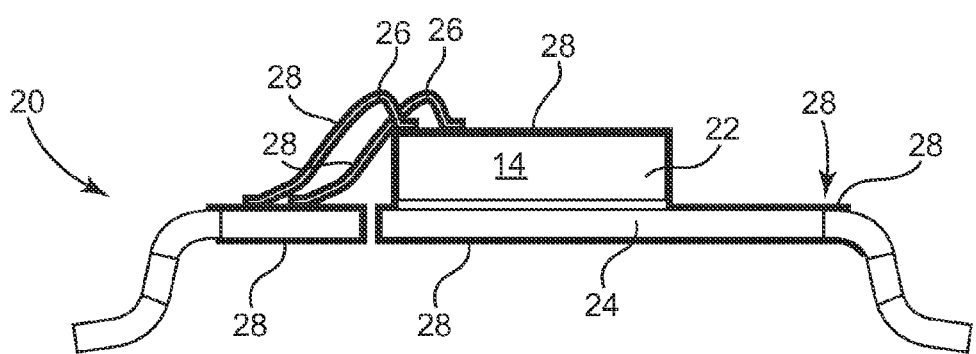
FIG. 2 is a cross-sectional view of a semiconductor device including a chip, a connector electrically connecting the chip to a carrier, and a sealant deposited over the chip, the connector, and the carrier according to one embodiment.

FIG. 2 is a cross-sectional view of a semiconductor device 20 according to one embodiment. Semiconductor device 20 includes a chip 22 attached to a carrier 24, one or more connectors 26 electrically connecting chip 22 to carrier 24, and a layer 28 uniformly deposited over exterior surfaces of connectors 26, chip 22 and a portion of the carrier 24 that is not covered by chip 22.

Semiconductor device 20 is hermetically sealed by layer 28 from moisture and oxygen. Sealant layer 16 is configured to minimize moisture exposure to the exterior of the connectors 26, the surfaces of the chip 22, and the portion of the carrier 24 not covered by the chip 22.

In one embodiment, semiconductor device 20 provides an insulated heat sink, where carrier 24 is a heat sink and layer 28 insulates heat sink 24. In one embodiment, semiconductor device 20 is configured for subsequent processing including encapsulation of device 20 to provide a semiconductor package suited for attachment to electronic devices.

Layer 28 includes sealants vapor deposited over chip 22, connectors 26 and carrier 24 to prevent the chip from delaminating from mold material that is deposited over the chip and to minimize corrosion and/or oxidation of chip 22 during use at elevated operational temperatures. In embodiments, layer 28 is chemical vapor deposited (CVD) at suitable CVD conditions to a substantially uniform thickness of between approximately 100 nm to approximately 20 micrometers.

In embodiments, layer 28 is provided as a carbon insulator, a carbon-containing layer such as hexamethyldisilazane, an amorphous a carbon-containing layer, or a vapor deposited insulator configured to protect the components coated by layer 28 from humidity, moisture, or oxidation during operation of chip 22. In one embodiment, layer 28 is an organic sealant/insulator. In one embodiment, layer 28 is an inorganic sealant/insulator.

In this specification, "organic" means a chemical compound including carbon.

In this specification, "inorganic" means a chemical composition that does not include carbon.

In this specification, "high temperature" means a temperature above 100 degrees Celsius, such that a high temperature application subjects devices to temperatures above 100 degrees Celsius.

Hexamathyldisilazane (HMDS), also known as BIS(trimethylsilyl)amine, is a chemical reagent having the molecular formula $C_6H_{19}NSi_2$ formed from ammonia substituted with two trimethylsilyl functional groups. It is a clear, colorless liquid suitable for vapor deposition in suitable chemical vapor deposition process. HMDS hydrolyzes slowly when exposed to water.

In one embodiment, layer 28 is provided at a diamond-like carbon (DLC). DLC includes any of seven forms of amorphous carbon materials that display the properties of natural diamond and include amounts of $sp^3$ hybridized carbon atoms. DLC occurs in two different types of crystalline polytypes, including cubic lattice and hexagonal lattice. DLC is suitable for combination with materials that are compatible with vacuum deposition processes. Some DLCs include fillers such as hydrogen, graphitic $SP^2$ carbon, or metals.

Figure 3:
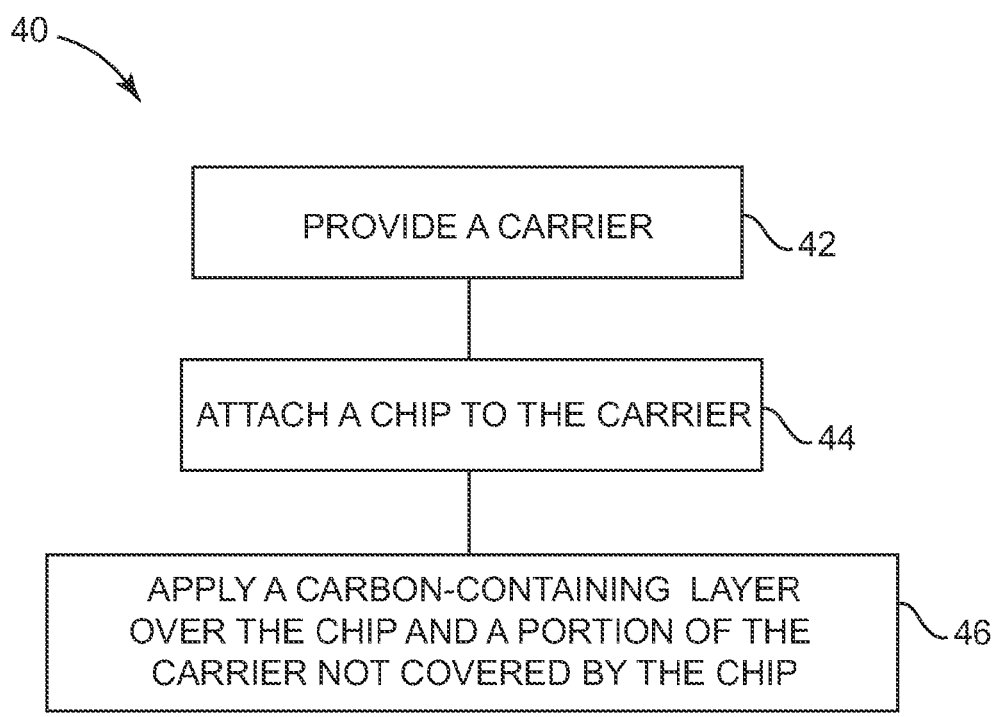
FIG. 3 is a flow chart of a method of manufacturing a semiconductor device according to one embodiment.

FIG. 3 is a flow chart 40 of a method of manufacturing a semiconductor device according to one embodiment. A carrier is provided at 42. At 44, a chip is attached to the carrier. At 46, a carbon-containing layer is applied over the chip and a portion of the carrier not covered by the chip.

Embodiments according to the method provide semiconductor devices configured for use in automotive applications and other applications in which the chip heats to an elevated temperature, for example above 100 degrees Celsius, during use. The carbon-containing layer that is applied over the chip and a portion of the carrier not covered by the chip prevent the chip from delaminating from the mold material deposited over the chip, and configures the chip and carrier to resist the undesirable effects caused by the presence of humidity during high temperature operation of the chip.

FIGS. 4A-4D are cross-sectional views of semiconductor devices manufactured to resist corrosion according to one embodiment.

FIG. 4A is a cross sectional view of chip 22 attached to carrier 24 by an attachment layer 50. Chip 22 includes a first surface 60 configured for attachment to carrier 24 and a second surface 62. In one embodiment, second surface 62 is an active surface including contact pads that form electrical communication pathways into chip 22. Chip 22 includes chips suited for semiconductor applications, including logic chips, control chips, power chips, or transistors. One or more such chips 22 are attached to carrier 24, as it is to be understood that a plurality of chips 22 could be attached to carrier 24, depending upon the design application.

Carrier 24 includes laminated substrates, flexible substrates, ceramic substrates, silicon substrates, leadframes, or non-leaded frames. Suitable leadframes include leaded leadframes such as thin outline leadframes, dual inline package leadframes, or quad flat package leadframes. Suitable non-leaded frames include very thin quad flat non-leaded leadframes and thin, small leadless packages.

In one embodiment, die attachment material 50 is an electrically conductive adhesive that connects chip 22 to carrier 24. In one embodiment, die attachment material 50 is a double-sided electrically conductive adhesive tape, although other suitable adhesives or attachment materials are also acceptable. In one embodiment, die attachment material 50 is an electrically isolating adhesive that connects chip 22 to carrier 24. In another embodiment, die attachment material 50 includes a solder paste, a solder, or another electrically conductive attachment material.

FIG. 4B is a cross-sectional view of connectors 26 electrically connecting chip 22 to carrier 24. In one embodiment, connectors 26 include wires electrically connected between active surface 62 of chip 22 and a lead 72 of carrier 24. When connectors 26 are wires, fabrication of semiconductor device 20 includes wire bonding connectors 26 between active surface 62 of chip 22 and lead 72 of carrier 24. Suitable wires for connector 26 include gold wires, silver wires, platinum wires, copper wires, or other suitable wires configured to electrically connect to active surface 62 of chip 22 to carrier 24. Other suitable connectors 26 include ribbons, clips, conducting lines applied in a planar process, or other suitable electrical connectors configured to electrically connect chip 22 to carrier 24.

Figure 4C:
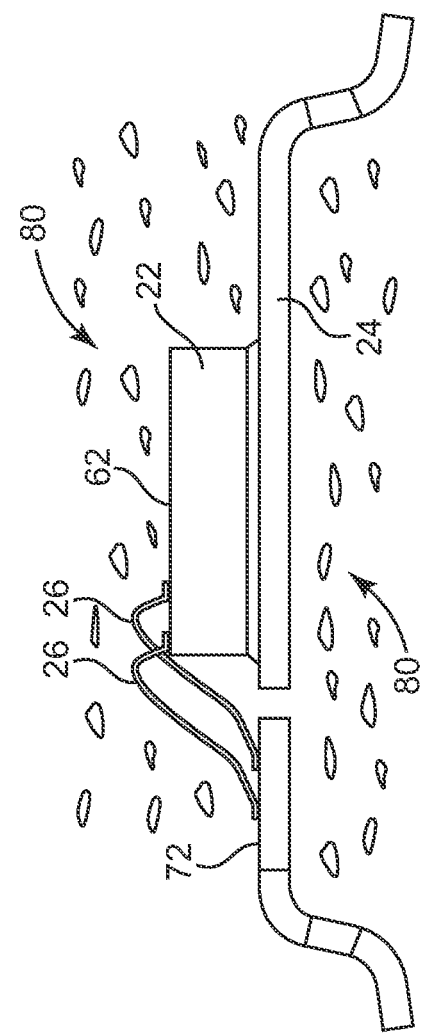
FIG. 4C is a cross-sectional view of the electrically connected chip and carrier being coated with a sealant/insulator in a deposition process according to one embodiment.

FIG. 4C is a cross-sectional view of material 80 deposited over chip 22, carrier 24, and connectors 26, and FIG. 4D is a cross-sectional view of layer 28 disposed on chip 22, carrier 24, and connectors 26. In one embodiment, material 80 is vapor deposited over active surface 62 of chip 22, lead 72 of carrier 24, and portions of carrier 24 that is not covered by chip 22 to form a sealant. Material 80 includes sealant materials, electrically insulating materials, or other materials that are configured to provide moisture resistance to the components of semiconductor device 20. In one embodiment, material 80 is a carbon-containing material that is chemical vapor deposited in a chamber onto components 22, 24, and 26. In one embodiment, material 80 is hexamethyldisilazane that is chemical vapor deposited in a chamber to coat active surface 62 and sides of chip 22, connectors 26, leads 72, and the portion of the carrier 24 that is not covered by chip 22.

Figure 5:
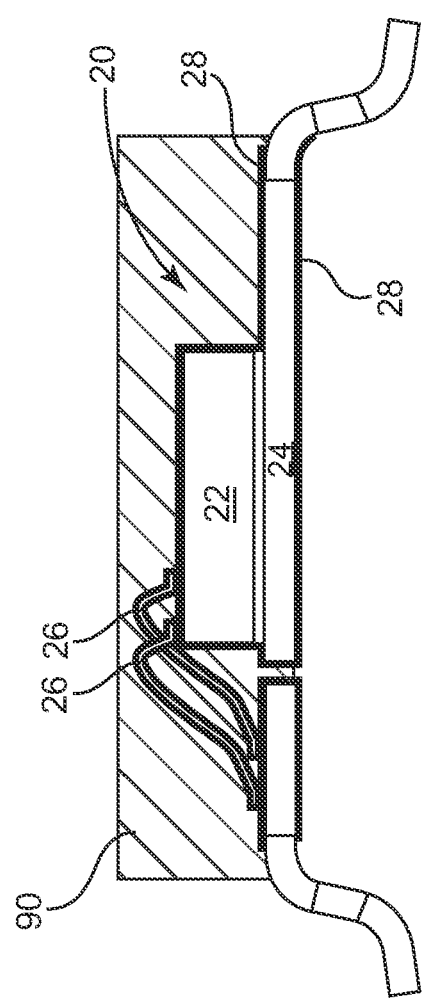
FIG. 5 is a cross-sectional view of the semiconductor device illustrated in FIG. 4D including encapsulation material deposited over the chip and the carrier according to one embodiment.

FIG. 5 is a cross-sectional view of semiconductor device 20 including layer 28 coated over chip 22 and carrier 24 and an encapsulation material 90 molded over a portion of semiconductor device 20. In one embodiment, encapsulation material 90 includes epoxy, cross-linking polymer, cross-linked polymer, resin such as a moldable resin, or other electrically insulating material suited for molding over chip 22 and carrier 24.

In one embodiment, layer 28 is coated over chip 22, carrier 24, and connectors 26 and is configured to provide enhanced or improved adhesion between chip 22 and encapsulation material 90. In this manner, layer 28 is configured to prevent delamination of encapsulation material 90 from the components 22, 24, 26, which prevents the ingress of moisture to the components and thus configures semiconductor device 20 for improved performance in high temperature applications.

Figure 6:
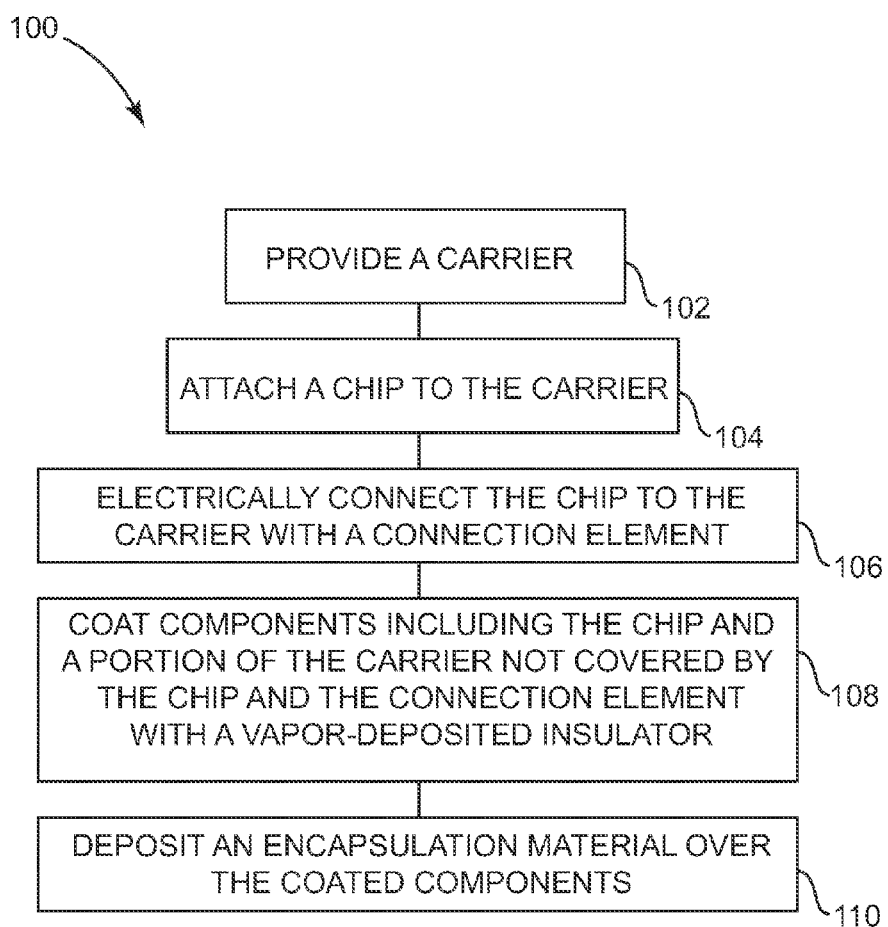
FIG. 6 is a flow chart of a method of providing corrosion resistance to a semiconductor device according to on embodiment.

FIG. 6 is a flow chart 100 of a method of fabricating a corrosion-resistant semiconductor device according to one embodiment. A carrier is provided at 102 and a chip is attached to the carrier at 104. At 106, a connection element is provided to electrically connect the chip to the carrier. In one embodiment, the connection element electrically connects an active surface of the chip to the carrier. At 108, components including the chip and a portion of the carrier not covered by the chip and the connection element are coated with a vapor deposited insulator. At 110, encapsulation material is deposited over the coated components. The resulting device is a semiconductor package having an insulator vapor-deposited and positioned between the encapsulation material and the chip/connectors/carrier, which enables these coated components to resist hydrolysis or uptake of moisture that can lead to corrosion of the electrical components. Semiconductor packages fabricated according to flow chart 100 are configured to operate over relatively long periods of time at relatively high temperatures in a manner that resists package delamination and corrosion of the chip and connectors.

Figure 7A:
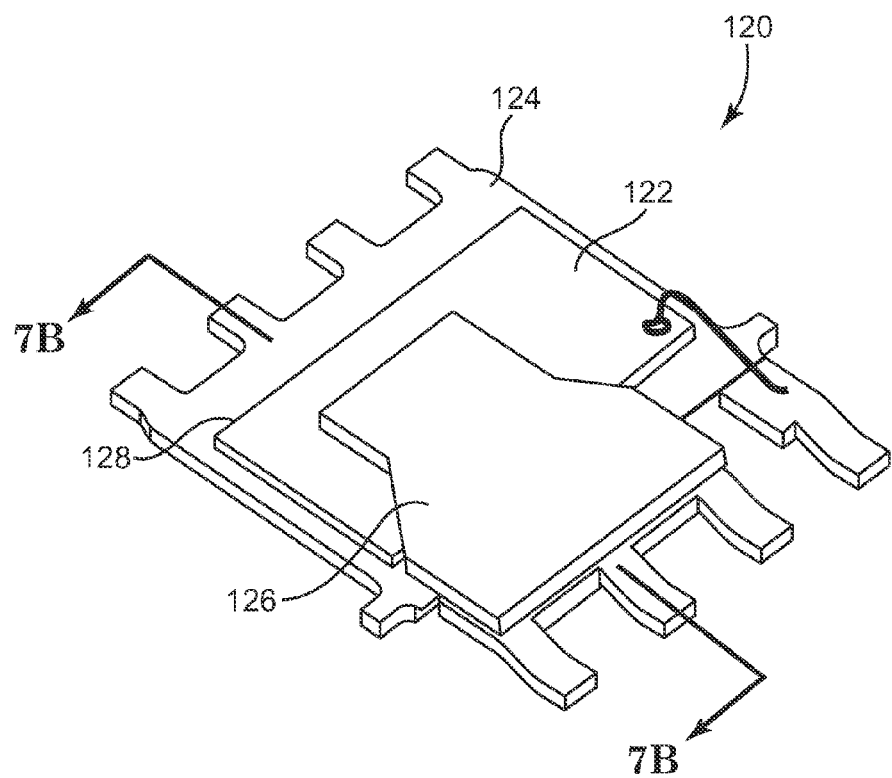
FIG. 7A is a perspective view and FIG. 7B is a cross-sectional view of a semiconductor device including a chip, a clip electrically connecting the chip to a carrier, and a sealant deposited over the chip, the clip, and the carrier according to one embodiment.
Figure 7B:
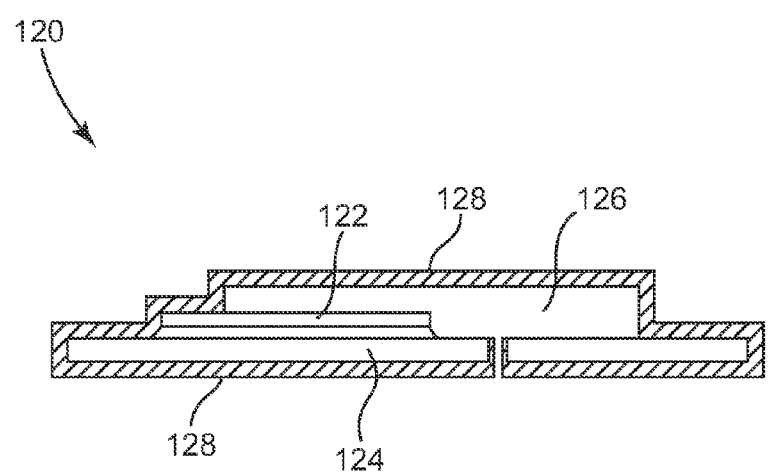

FIG. 7A is a perspective view and FIG. 7B is a cross-sectional view of a semiconductor device 120 according to another embodiment. Semiconductor device 120 includes a chip 122 attached to a carrier 124, a clip 126 electrically connecting the chip 122 to the carrier 124, and a layer 128 deposited over the chip 122, the clip 126, and the carrier 124. Chip 122 is similar to chips 22 described above and carrier 124 is similar to carriers 24 described above. In one embodiment, clip 126 is configured to provide source-interconnect useful for connecting device 120 to other electronic devices. Layer 128 is similar to layer 28 described above.

Figure 8:
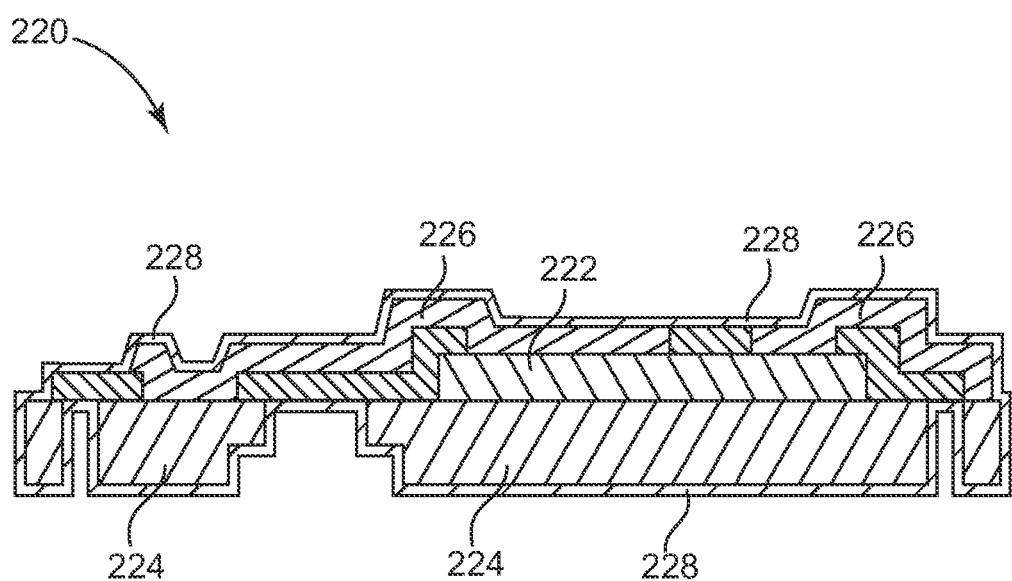
FIG. 8 is a cross-sectional view of a semiconductor device including a sealant deposited over a chip and conducting lines connecting the chip to a laminated substrate according to one embodiment.
Figure 9:
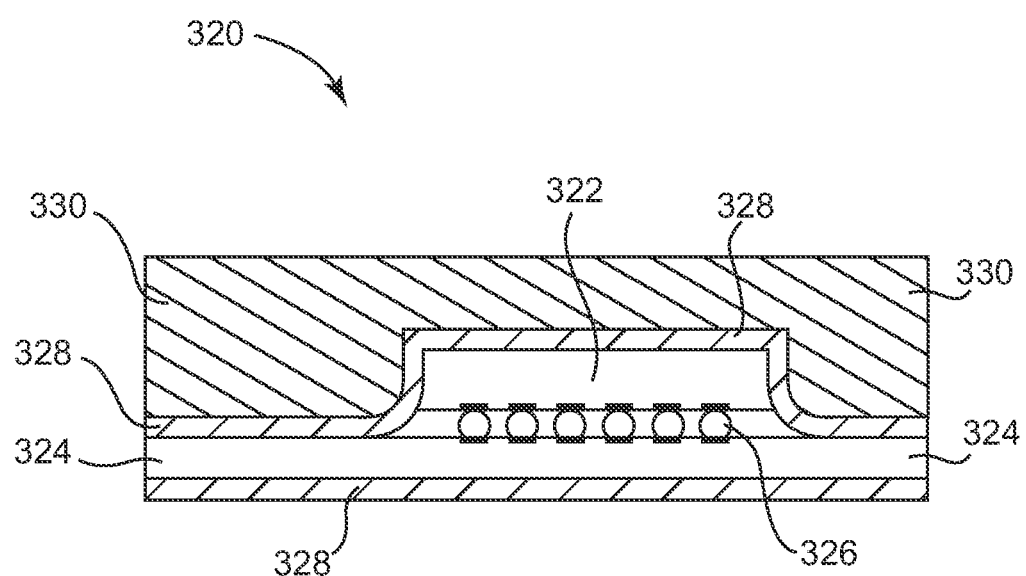
FIG. 9 is a cross-sectional view of a semiconductor device including a chip flip-chip attached to a carrier and an anti-corrosion layer disposed between the chip and encapsulation material according to one embodiment.
Figure 10:
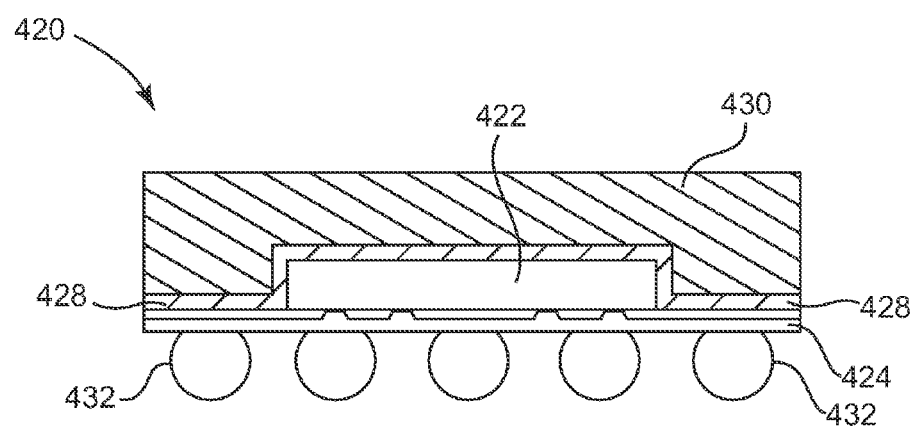
FIG. 10 is a cross-sectional view of a semiconductor device including a chip having a direct first level interconnect established through a thin film redistribution layer, and an anti-corrosion layer disposed between the chip and encapsulation material according to one embodiment.

FIGS. 8-10 illustrate various semiconductor packages, each including a sealant or anti-corrosion layer coated over a carrier and a chip attached to the carrier.

FIG. 8 is a cross-sectional view of a planar interconnect semiconductor device 220 according to one embodiment. Planar interconnect semiconductor device 220 includes a chip 222 attached to a laminated substrate 224, conducting lines 226 connected to the chip 222 and the laminated substrate 224 through through-holes, and a layer 228 deposited over the chip 222, the conducting lines 226, and the laminated substrate 224.

In one embodiment, the through-holes are formed through an insulation layer 230 that is deposited over chip 222 and laminated substrate 224, and conducting lines 226 are printed over chip 222 and laminated substrate 224 to fill the through-holes and interconnect chip 222 to substrate 224.

Layer 228 is similar to layer 28 described above and is vapor deposited over chip 222, lines 226 and substrate 224 to minimize corrosion and/or oxidation of chip 222 during operation at elevated temperatures.

FIG. 9 is a cross-sectional view of a flip-chip semiconductor device 320 according to one embodiment. Device 320 includes a chip 322 flip-chip attached to a carrier 324 by solder balls 326 and an anti-corrosion layer 328 disposed between chip 322 and encapsulation material 330. In one embodiment, device 320 is provided as an encapsulated package and anti-corrosion layer 328 is configured to promote adhesion between encapsulation material 330 and chip 322 and carrier 324 while minimizing environmental corrosion of the interconnects between chip 322 and carrier 324. In one embodiment, anti-corrosion layer 328 is deposited as a thin uniform layer over all exposed sides of carrier 324.

FIG. 10 is a cross-sectional view of a directly interconnected semiconductor device 420 according to one embodiment. Directly interconnected semiconductor device 420 includes a chip 422 communicating with a thin film redistribution layer 424 and an anti-corrosion layer 428 disposed between the chip 422 and encapsulation material 430. Thin film redistribution layer 424 provides an electrical pathway between chip 422 and other devices to which chip 422 is attached. Balls 432 are provided to electrically connect device 420 to other electronic devices, such as circuit boards.

Consistent with the embodiments described above, anti-corrosion layer 428 promotes adhesion between the components and encapsulation material 430 and also minimizes or eliminates the environmental (moisture, oxidation, etc.) corrosion of the electrical contacts of package 420.

Embodiments described herein provide a semiconductor package including a carrier, a chip attached to the carrier, a sealant/insulator vapor deposited over the chip and the carrier. The sealant protects the chip and the carrier from undesirable corrosion and/or oxidation that degrades the electrical performance of the chip. When the package is encapsulated, the sealant/insulator promotes adhesion between the encapsulation material and the chip, which minimizes the possibility of the encapsulation material delaminating from the chip during use.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of sealed chips and connectors in semiconductor devices, as discussed herein. Therefore, it is intended that this invention be limited only by the claims and the equivalents thereof.

What is claimed is:

1. A semiconductor device comprising:
   a carrier;
   a chip attached to the carrier;
   an amorphous carbon sealant layer deposited directly in contact with and over the chip and the carrier to form a sealed chip and a sealed carrier; and
   encapsulation material deposited over the sealed chip and the sealed carrier, wherein the amorphous carbon sealant layer is in direct contact with both the encapsulation material and the chip and carrier, and wherein the encapsulation material forms an exterior surface of the semiconductor device.

2. The semiconductor device of claim 1, wherein the chip comprises an active surface electrically connected to the carrier by a connector, the sealant layer deposited over an exterior of the connector, the active surface and sides of the chip, and a portion of the carrier not covered by the chip.

3. The semiconductor device of claim 2, wherein the carrier and the chip comprise one of a chip wire bonded to a leadframe, a chip connected to a leadframe with a clip, a chip communicating with a laminated substrate through conductive through-holes, a chip flip-chip attached to a carrier, and a chip communicating with a film redistribution layer.

4. The semiconductor device of claim 1, wherein the carrier comprises a leadframe having a first surface opposite a second surface, the leadframe comprising a chip pad and leads adjacent to the chip pad, the sealant coated over an entirety of the first and second surfaces of the chip pad not covered by the chip and a portion of the first and second surfaces of the leads.

5. A semiconductor device configured for use in high temperature applications, the device comprising:
   a carrier;
   a chip attached to the carrier and including a connector coupled between the chip and the carrier; and
   an amorphous carbon sealant layer deposited directly in contact with and over an exterior of the connector, surfaces of the chip, and a portion of the carrier not covered by the chip, wherein the sealant layer is in direct contact with the chip, the carrier, and an encapsulation material encapsulating the chip and at least portions of the carrier, the encapsulation material forming an exterior surface of the semiconductor device;
   wherein the sealant layer is configured to minimize moisture exposure to the exterior of the connector, the surfaces of the chip, and the portion of the carrier not covered by the chip.

6. The semiconductor device of claim 5, wherein the sealant layer comprises a uniformly thin insulation layer deposited onto the active surface and sides of the chip, the exterior surface of the connector, and the portion of the carrier not covered by the chip.

* * * * *